(12) United States Patent
Tateyama et al.

(10) Patent No.: US 8,131,060 B2
(45) Date of Patent: Mar. 6, 2012

(54) PROCESS CONTROL METHOD, DATA REGISTRATION PROGRAM, AND METHOD FOR MANUFACTURING ELECTRONIC DEVICE

(75) Inventors: Kazuki Tateyama, Kanagawa-ken (JP); Hideki Ogawa, Tokyo (JP); Satoshi Imi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1097 days.

(21) Appl. No.: 11/956,951

(22) Filed: Dec. 14, 2007

(65) Prior Publication Data

US 2008/0166039 A1   Jul. 10, 2008

(30) Foreign Application Priority Data

Dec. 15, 2006   (JP) ................................. 2006-338193

(51) Int. Cl.
*G06K 9/00* (2006.01)
(52) U.S. Cl. ......... 382/150; 382/141; 382/149; 382/151
(58) Field of Classification Search .................. 382/141, 382/149, 150, 151, 154, 190; 356/237.1–237.5; 29/833, 825, 832, 840
See application file for complete search history.

(56) References Cited

U.S. PATENT DOCUMENTS

| | | | |
|---|---|---|---|
| 6,310,406 B1 * | 10/2001 | Van Berkel | 290/43 |
| 7,114,249 B2 * | 10/2006 | Murakami | 29/833 |
| 7,356,176 B2 * | 4/2008 | Fujii et al. | 382/141 |
| 7,672,501 B2 * | 3/2010 | Minakata et al. | 382/141 |

FOREIGN PATENT DOCUMENTS

| | | |
|---|---|---|
| JP | 6-112295 | 4/1994 |
| JP | 2004-249673 | 9/2004 |
| JP | 2006237236 A * | 9/2006 |

OTHER PUBLICATIONS

Office Action issued Sep. 5, 2011 in Japanese patent Application No. 2006-338193 (with English translation).

* cited by examiner

*Primary Examiner* — Sang Nguyen
(74) *Attorney, Agent, or Firm* — Oblon, Spivak, McClelland, Maier & Neustadt, L.L.P.

(57) ABSTRACT

A process control method is provided for a surface mount line including a solder printer for printing solder on a surface of a substrate, a solder print inspector for inspecting the printed solder and outputting printing quality data, a mounter for mounting components on the substrate with the solder printed, a mount inspector for inspecting a state of the mounted components and outputting mounting quality data, a reflow furnace for heating the solder to solder the components to the substrate, and a soldering inspector for inspecting a state of the soldering and outputting soldering pass/fail data. The process control method includes: retrieving the printing quality data, the mounting quality data, and the soldering pass/fail data from a primary recorder with the printing quality data, the mounting quality data, and the soldering pass/fail data recorded therein, calculating representative data for each said component from the printing quality data, and recording the representative data, the mounting quality data, and the soldering pass/fail data for each said component in a secondary recorder; and determining whether the solder printer and the mounter need adjustment by using the data of the components with the soldering pass/fail data indicating conforming among the data recorded in the secondary recorder.

12 Claims, 6 Drawing Sheets

| | PRINTING QUALITY DATA | | | MOUNTING QUALITY DATA | | | SOLDERING PASS/FAIL DATA |
|---|---|---|---|---|---|---|---|
| COMPONENT | ELECTRODE | SOLDER HEIGHT | SOLDER VOLUME | COMPONENT | X-DISPLACEMENT | Y-DISPLACEMENT | |
| 0001 | 1 | 101.1 | 96.3 | 0001 | -40 | -11 | NG |
| 0001 | 2 | 104.6 | 99.4 | 0002 | 0 | 0 | |
| 0001 | 3 | 112.8 | 112.6 | 0003 | 0 | 4 | 0003 |
| 0001 | 4 | 105.6 | 102.5 | 0004 | 17 | 16 | |
| 0002 | 1 | 100.2 | 103.2 | | | | |
| 0002 | 2 | 101.4 | 102.1 | | | | |
| 0003 | 1 | 99.6 | 95.8 | | | | |
| 0004 | 1 | 94.7 | 87.1 | | | | |
| 0003 | 2 | 85.5 | 80.9 | | | | |
| 0004 | 2 | 90.7 | 86.9 | | | | |

FIG.3B

| COMPONENT | REPRESENTATIVE DATA | | | | MOUNTING QUALITY DATA | | SOLDERING PASS/FAIL DATA |
|---|---|---|---|---|---|---|---|
| | SOLDER HEIGHT | | SOLDER VOLUME | | X-DISPLACEMENT | Y-DISPLACEMENT | |
| | AVERAGE | σ | AVERAGE | σ | | | |
| 0001 | 106.0 | 4.9 | 102.7 | 7.1 | -40 | -11 | OK |
| 0002 | 100.8 | 0.8 | 102.7 | 0.8 | 0 | 0 | OK |
| 0003 | 92.6 | 10.0 | 88.4 | 10.5 | 0 | 4 | NG |
| 0004 | 92.7 | 2.8 | 87.0 | 0.1 | 17 | 16 | OK |

PROCESS CONTROL METHOD, DATA REGISTRATION PROGRAM, AND METHOD FOR MANUFACTURING ELECTRONIC DEVICE

CROSS-REFERENCE TO RELATED APPLICATIONS

This application is based upon and claims the benefits of priority from the prior Japanese Patent Application No. 2006-338193, filed on Dec. 15, 2006; the entire contents of which are incorporated herein by reference.

BACKGROUND OF THE INVENTION

1. Field of the Invention

This invention relates to a process control method, a data registration program, and a method for manufacturing an electronic device, and more particularly to a process control method for a surface mount line for manufacturing an electronic device by packaging components on a substrate, a data registration program used in this process control method, and a method for manufacturing an electronic device using this process control method.

2. Background Art

An electronic device is manufactured by packaging components on a substrate using a surface mount line provided with a solder printer, a mounter, and a reflow furnace. On the surface mount line, components are soldered to the substrate by printing solder on the substrate, mounting the components on the substrate, and then melting and solidifying the solder. Conventionally, in such a surface mount line, the quality of the electronic device is controlled by controlling the process condition of each apparatus constituting the line (see, e.g., JP-A 2004-249673 (Kokai)).

The method of controlling the quality of a product by controlling the process condition of each apparatus is successfully applied to the case where the process condition has high controllability and the quality of the product depends almost only on the process condition such as in the manufacturing line for semiconductor devices. However, this method is not successfully applied to the surface mount line. This is because, in the surface mount line, the quality of the product (electronic device) greatly depends on the state of materials such as the quality of the substrate and the viscosity of solder paste in addition to the process condition, and the process condition is not in one-to-one correspondence with the quality of the product. For example, the viscosity of solder paste varies with time after opening the container and with ambient temperature and humidity. The mounting position accuracy also depends on the type of components. Furthermore, the quality of the product may be deteriorated by the inherent defect of the substrate. Hence, in the surface mount line, accurate process control cannot be achieved by simply controlling the process condition.

SUMMARY OF THE INVENTION

According to an aspect of the invention, there is provided a process control method for a surface mount line including a solder printer configured to print solder on a surface of a substrate, a solder print inspector configured to inspect the printed solder and outputting printing quality data, a mounter configured to mount components on the substrate with the solder printed, a mount inspector configured to inspect a state of the mounted components and outputting mounting quality data, a reflow furnace configured to heat the solder to solder the components to the substrate, and a soldering inspector configured to inspect a state of the soldering and outputting soldering pass/fail data, the process control method including: retrieving the printing quality data, the mounting quality data, and the soldering pass/fail data from a primary recorder with the printing quality data, the mounting quality data, and the soldering pass/fail data recorded therein, calculating representative data for each of the components from the printing quality data, and recording the representative data, the mounting quality data, and the soldering pass/fail data for each of the components in a secondary recorder; and determining whether the solder printer and the mounter need adjustment by using the data of the components with the soldering pass/fail data indicating conforming among the data recorded in the secondary recorder.

According to another aspect of the invention, there is provided a data registration program for a surface mount line including a solder printer configured to print solder on a surface of a substrate, a solder print inspector configured to inspect the printed solder and outputting printing quality data, a mounter configured to mount components on the substrate with the solder printed, a mount inspector configured to inspect a state of the mounted components and outputting mounting quality data, a reflow furnace configured to heat the solder to solder the components to the substrate, and a soldering inspector configured to inspect a state of the soldering and outputting soldering pass/fail data, the data registration program registering each of the data by causing a computer to execute: retrieving the printing quality data, the mounting quality data, and the soldering pass/fail data from a primary recorder with the printing quality data, the mounting quality data, and the soldering pass/fail data recorded therein; calculating representative data for each of the components from the printing quality data; and recording the representative data, the mounting quality data, and the soldering pass/fail data for each of the components in a secondary recorder.

According to another aspect of the invention, there is provided a method for manufacturing an electronic device with components packaged on a substrate, the method including: printing solder on a surface of the substrate; inspecting the printed solder and recording printing quality data in a primary recorder; mounting the components on the substrate with the solder printed; inspecting a state of the mounted components and recording mounting quality data in the primary recorder; heating the solder to solder the components to the substrate; inspecting a state of the soldering and recording soldering pass/fail data in the primary recorder; retrieving the printing quality data, the mounting quality data, and the soldering pass/fail data from the primary recorder, calculating representative data for each of the components from the printing quality data, and recording the representative data, the mounting quality data, and the soldering pass/fail data for each of the components in a secondary recorder; determining whether the solder printer and the mounter need adjustment by using the data of the components with the soldering pass/fail data indicating conforming among the data recorded in the secondary recorder; and adjusting the solder printer in response to the determination in the determining step that the solder printer needs adjustment, and adjusting the mounter in response to the determination in the determining step that the mounter needs adjustment.

DETAILED DESCRIPTION OF THE INVENTION

An embodiment of the invention will now be described with reference to the drawings.

Figure 1:
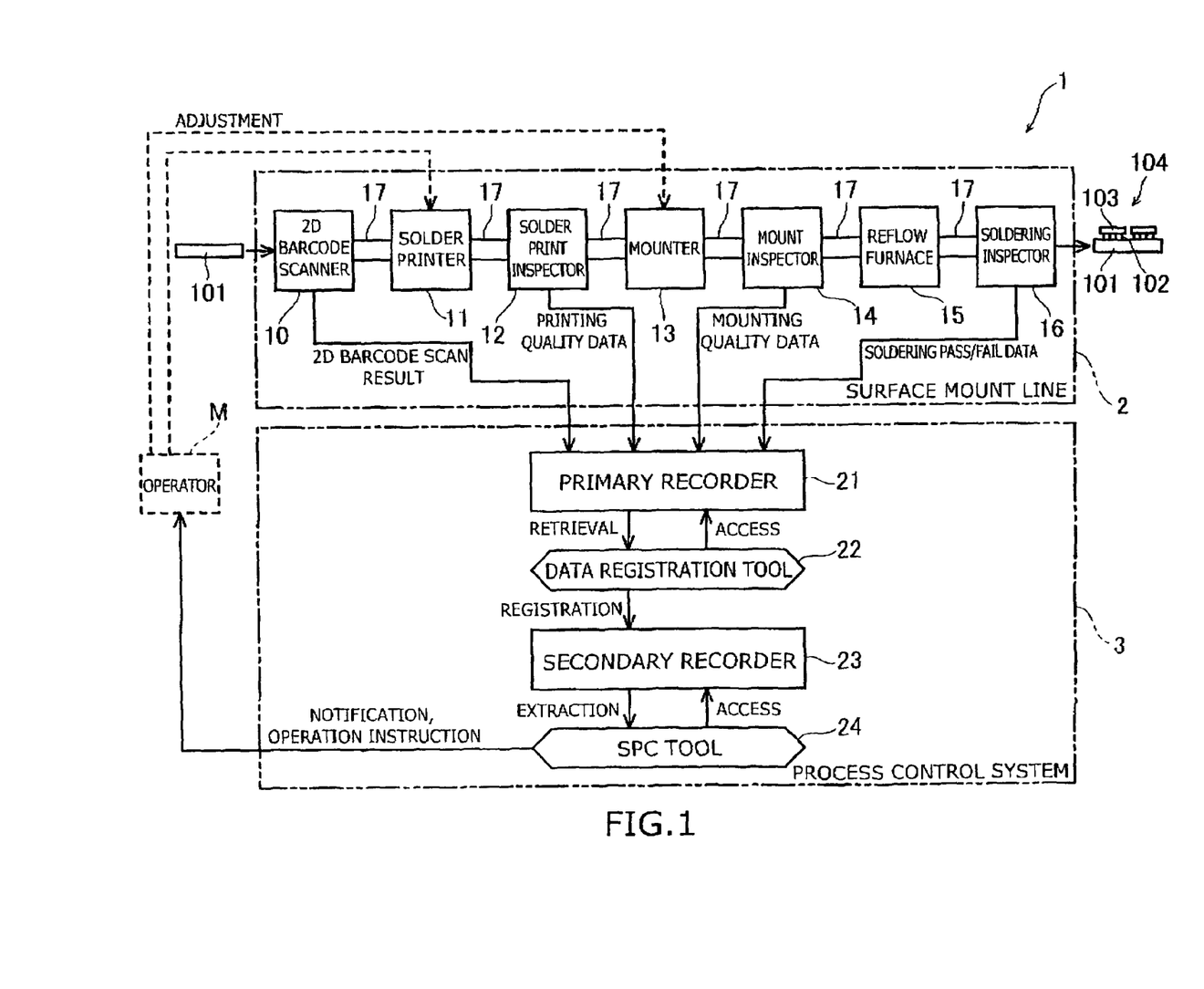
FIG. 1 is a block diagram illustrating an electronic device manufacturing process in this embodiment.

FIG. 1 is a block diagram illustrating an electronic device manufacturing process in this embodiment.

As shown in FIG. 1, the electronic device manufacturing process 1 in this embodiment is based on a surface mount line 2 for printing solder 102 on a substrate 101 and packaging components 103 with the solder 102 to manufacture an electronic device 104, and a process control system 3 for process control of the surface mount line 2. The electronic device manufacturing process 1 may include a plurality of surface mount lines 2. In that case, the process control of the surface mount lines 2 is performed by one process control system 3.

The surface mount line 2 includes a two-dimensional barcode scanner 10, a solder printer 11, a solder print inspector 12, a mounter 13, a mount inspector 14, a reflow furnace 15, and a soldering inspector 16 in this order. Furthermore, the surface mount line 2 includes a conveyor 17 for conveying the substrate 101 between these apparatuses. The substrate 101 is conveyed by the conveyor 17 and passes through each apparatus of the surface mount line 2. Thus a plurality of components 103 are packaged thereon, and an electronic device 104 is manufactured.

A two-dimensional barcode (QR code) identifying the substrate 101 is printed on the surface of the substrate 101. Furthermore, a plurality of locations are defined on the surface of the substrate 101, and the component 103 is packaged on each location. Each location of the substrate 101 is provided with a plurality of electrodes (not shown) corresponding to the component 103 to be packaged. The number of electrodes corresponding to each component 103 depends on the type of the component 103.

The two-dimensional barcode scanner 10 scans a two-dimensional barcode (QR code) printed on the substrate 101 to identify the substrate 101 fed into the surface mount line 2. Then the two-dimensional barcode scanner 10 outputs the scan result of the QR code. The solder printer 11 prints paste solder 102 on the electrodes formed on the surface of the substrate 101.

The solder print inspector 12 inspects the solder 102 printed on the substrate 101 by the solder printer 11 and outputs the inspection result as "printing quality data". For example, the solder print inspector 12 is provided with an AOI (automated optical inspection system), which measures the shape of the printed solder 102 for each electrode, and outputs the result as numerical data. In an example, the solder print inspector 12 measures the height and volume of the solder 102 and outputs the result as a set of numerical data along with data representing the location of the inspected region.

The mounter 13 mounts a component 103 on each location of the substrate 101. The mount inspector 14 inspects the state of the mounted component 103 and outputs the result as "mounting quality data". For example, the mount inspector 14 is provided with an AOI, which measures the amount of displacement of the actual mounting position from the scheduled mounting position of the component 103 on the substrate 101 in the two mutually orthogonal direction (hereinafter referred to as "X-direction" and "Y-direction") for each component 103. Then the mount inspector 14 outputs the result as two numerical data along with data representing the location of the inspected component 103.

The reflow furnace 15 heats the substrate 101, the solder 102, and the components 103 and then cools them to solder the components 103 to the substrate 101. The soldering inspector 16 uses an AOI to inspect the state of soldering between the substrate 101 and the components 103 and outputs the inspection result as "soldering pass/fail data". For example, the soldering inspector 16 outputs "OK" if the state of soldering is good, and outputs "NG" if it is defective. The soldering inspector 16 also outputs the location of the inspected component 103.

On the other hand, the process control system 3 includes a primary recorder 21, a data registration tool 22, a secondary recorder 23, and an SPC (statistical process control) tool 24. The primary recorder 21 is illustratively composed of a hard disk built in or connected to a personal computer (not shown). The primary recorder 21 receives the scan result of the QR code outputted from the two-dimensional barcode scanner, as well as the "printing quality data" outputted from the solder print inspector 12, the "mounting quality data" outputted from the mount inspector 14, and the "soldering pass/fail data" outputted from the soldering inspector 16 along with location information, and stores these data for a certain period. It is noted that the primary recorder 21 may be composed of a plurality of hard disks so as to receive data in parallel. Then the input speed can be enhanced.

The data registration tool 22 is illustratively composed of a data registration program installed on a personal computer (not shown). The data registration program causes the computer to execute a procedure of retrieving "printing quality data", "mounting quality data", and "soldering pass/fail data" from the primary recorder 21, a procedure of calculating "representative data" for each component 103 from the "printing quality data", and a procedure of recording the "representative data", the "mounting quality data", and the "soldering pass/fail data" for each component 103 to the secondary recorder 23.

The calculation of "representative data" is performed by aggregating numerical data included in the "printing quality data" such as numerical data representing the shape of the solder 102, e.g., height and volume, printed on the substrate 101 for each component 103 to which the solder 102 is connected, to obtain statistics such as the average and standard deviation for each component 103. The number of numerical data corresponding to each component 103 is proportional to the number of electrodes corresponding to the component 103, and the number of electrodes corresponding to each component 103 depends on the type of the component 103. Hence the number of numerical data associated with each component 103 depends on the type of the component 103. Thus the "representative data" is calculated for each component 103 as described above so that the quality of solder printing for the components 103 with different numbers of electrodes can be represented by the same number of numerical values.

The secondary recorder 23 is illustratively composed of a hard disk built in or connected to a personal computer (not shown) and records, for each component 103, the "representative data", the "mounting quality data", and the "soldering pass/fail data" inputted by the data registration tool 22.

The SPC tool 24 is illustratively composed of an SPC program installed on a personal computer (not shown). The SPC program causes the computer to execute a procedure of extracting the data of components 103 with the "soldering pass/fail data" indicating conforming (OK) from the data recorded in the secondary recorder 23 to determine for each type of component 103 whether the condition of the solder printer 11 and the mounter 13 needs adjustment.

For example, the average and standard deviation of the "representative data" of a component 103 with the "soldering pass/fail data" being "OK" (hereinafter also referred to as "conforming item") are obtained, and an upper and lower control bound are defined on the basis of the average and standard deviation. Then, if the representative data of the height of the solder 102 printed by the solder printer 11 falls outside the range between these control bounds (hereinafter referred to as "control range"), it is determined that the solder printer 11 needs adjustment. Likewise, control bounds are defined on the basis of the "mounting quality data" of conforming items, and it is determined with reference to the control bounds whether the mounter 13 needs adjustment.

Furthermore, the SPC program causes the computer to execute a procedure of issuing an operation instruction to adjust the solder printer 11 in response to the determination that the solder printer 11 needs adjustment, and an operation instruction to adjust the mounter 13 in response to the determination that the mounter 13 needs adjustment. Moreover, the SPC program causes the personal computer to execute a procedure of notifying an operator of these determination results via electronic mail or otherwise.

The above computer with the data registration program installed thereon, the computer that the hard disk constituting the secondary recorder 23 is built in or connected to, and the computer with the SPC program installed thereon may be identical or different.

Next, a description is given of the operation of the electronic device manufacturing process 1 of this embodiment, that is, the method for manufacturing an electronic device according to this embodiment.

First, the operation of the surface mount line 2 is described.

Figure 2:
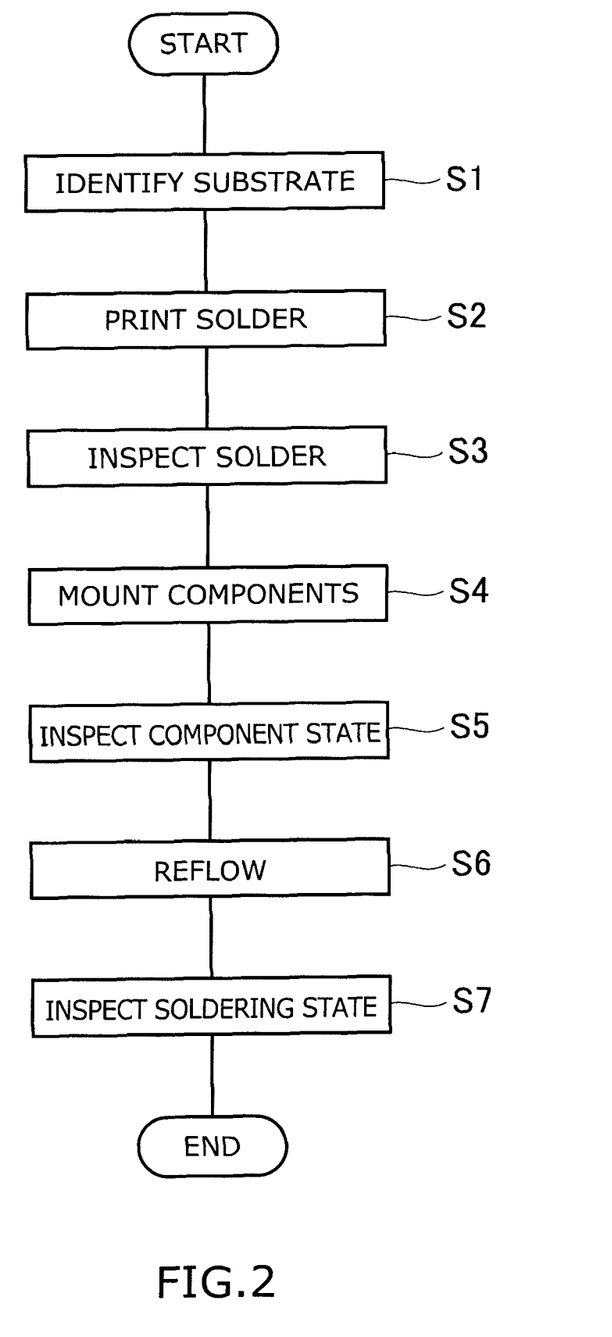
FIG. 2 is a flow chart illustrating the operation of the surface mount line of this embodiment.

FIG. 2 is a flow chart illustrating the operation of the surface mount line of this embodiment.

As shown in FIG. 1 and step S1 of FIG. 2, when a substrate 101 is fed into the surface mount line 2, the two-dimensional barcode scanner 10 scans the two-dimensional barcode (QR code) of the substrate 101 and outputs the result to the primary recorder 21. Then the conveyor 17 conveys the substrate 101 to the solder printer 11.

Next, as shown in step S2, the solder printer 11 prints paste solder 102 on each electrode formed on the surface of the substrate 101. Then the conveyor 17 conveys the substrate 101 to the solder print inspector 12.

Next, as shown in step S3, the solder print inspector 12 inspects the solder 102 printed on the substrate 101 and outputs the result as "printing quality data" to the primary recorder 21, which then records it. In an example, the solder print inspector 12 measures the shape, e.g., the height and volume, of the solder 102 formed on each electrode of the substrate 101 and outputs the result as a set of numerical data. At this time, the solder print inspector 12 also outputs the location of the inspected region along with each set of numerical data. Then the conveyor 17 conveys the substrate 101 to the mounter 13.

Next, as shown in step S4, the mounter 13 mounts a plurality of components 103 on the substrate 101. Here, the mounter 13 mounts a component 103 for each location of the substrate 101 so that the electrodes of the component 103 abut the solder 102. Then the conveyor 17 conveys the substrate 101 to the mount inspector 14.

Next, as shown in step S5, the mount inspector 14 inspects the state of the component 103 mounted on the substrate 101 and outputs the result as "mounting quality data" to the primary recorder 21, which then records it. For example, the mount inspector 14 measures the amount of displacement of the actual mounting position from the scheduled mounting position in the X-direction and Y-direction for each component 103 and outputs the result as a set of numerical data. At this time, the mount inspector 14 also outputs the location of the inspected component 103. Then the conveyor 17 conveys the substrate 101 to the reflow furnace 15.

Next, as shown in step S6, the reflow furnace 15 heats the substrate 101, the solder 102, and the components 103 and then cools them. Thus the solder 102 is once melted and then solidified so that the electrodes of the components 103 are soldered to the electrodes of the substrate 101. Consequently, the components 103 are packaged on the substrate 101. Then the conveyor 17 conveys the substrate 101 to the soldering inspector 16.

Next, as shown in step S7, the soldering inspector 16 inspects, for each component 103, the state of soldering between the substrate 101 and the component 103 and outputs data representing "OK" if the state of soldering is good and representing "NG" if it is defective as "soldering pass/fail data" to the primary recorder 21. At this time, the soldering inspector 16 also outputs the location of the inspected component 103, and the primary recorder 21 then records it. Thus an electronic device 104 is manufactured.

Next, a description is given of the operation of the process control system 3, that is, the process control method for the surface mount line 2. This process control method constitutes part of the method for manufacturing an electronic device according to this embodiment.

Figure 3A:
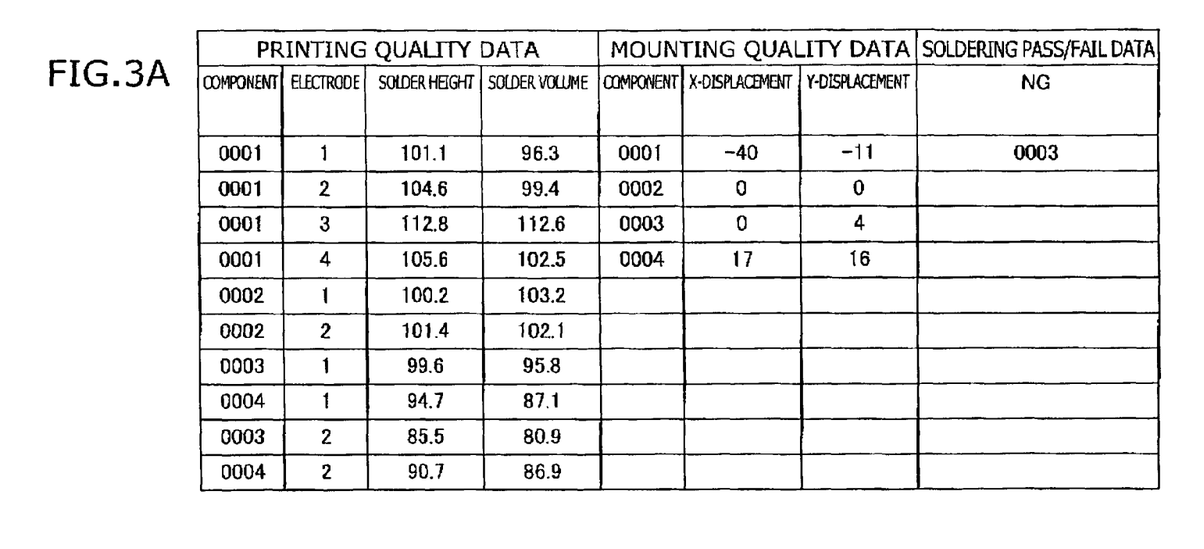
FIG. 3A illustrates the format of data recorded in the primary recorder.
Figure 3B:
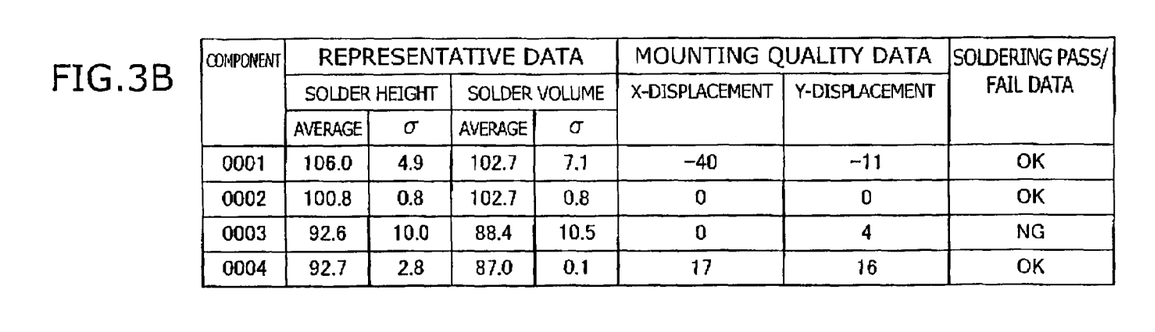
FIG. 3B illustrates the format of data recorded in the secondary recorder.

FIG. 3A illustrates the format of data recorded in the primary recorder, and FIG. 3B illustrates the format of data recorded in the secondary recorder.

Figure 4:
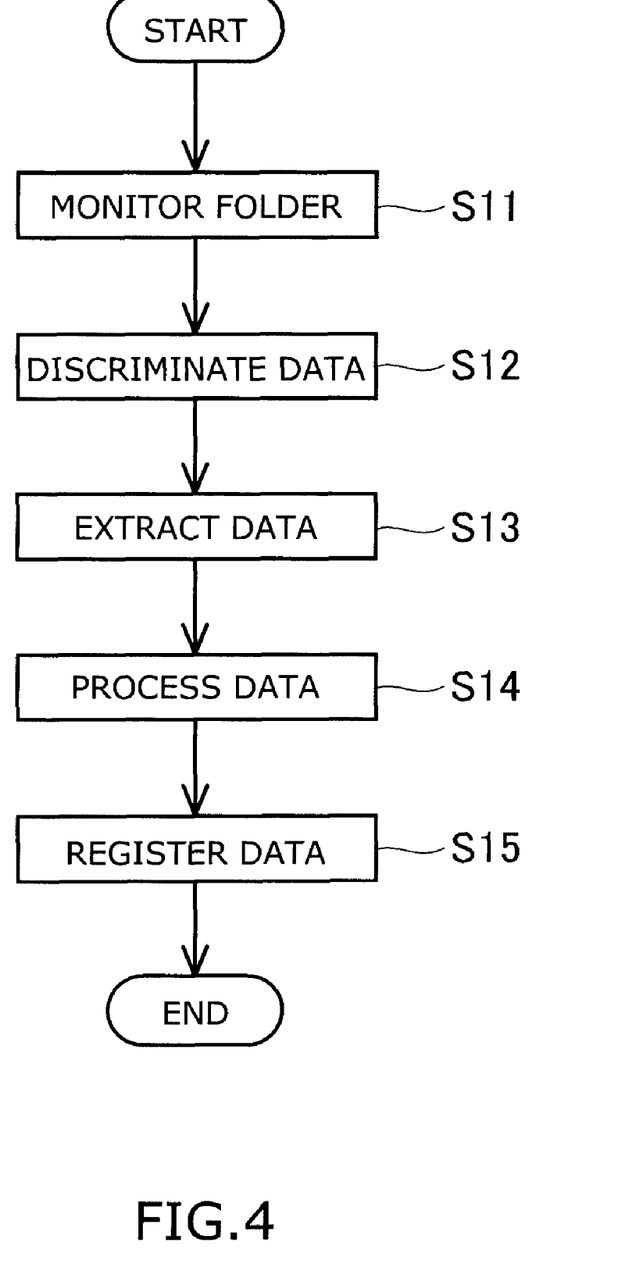
FIG. 4 is a flow chart illustrating the operation of the data registration tool of this embodiment.

FIG. 4 is a flow chart illustrating the operation of the data registration tool of this embodiment.

Figure 5:
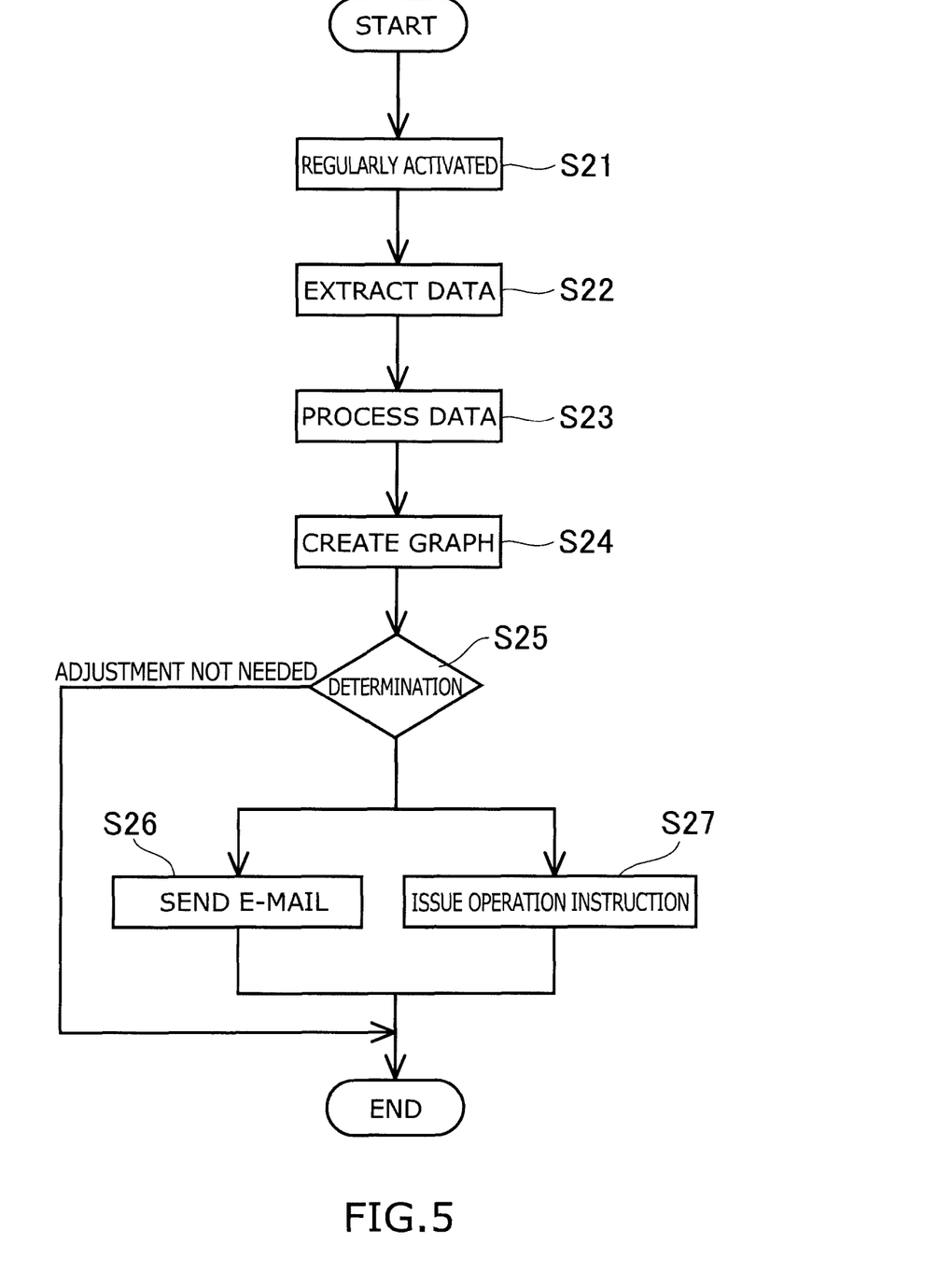
FIG. 5 is a flow chart illustrating the operation of the SPC tool of this embodiment.

FIG. 5 is a flow chart illustrating the operation of the SPC tool of this embodiment.

Figure 6:
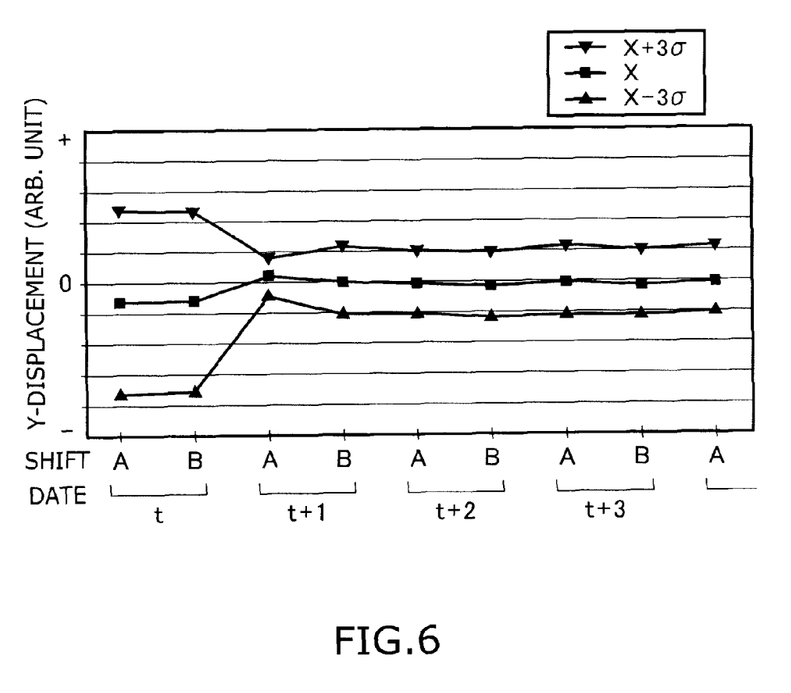
FIG. 6 is a graph showing a visualized example of process capability, where the horizontal axis represents operation shift, and the vertical axis represents the amount of mounting displacement in the Y-direction.

FIG. 6 is a graph showing a visualized example of process capability, where the horizontal axis represents operation shift, and the vertical axis represents the amount of mounting displacement in the Y-direction.

As described above, in steps S2, S4, and S6 of FIG. 2, the primary recorder 21 shown in FIG. 1 receives and records "printing quality data", "mounting quality data", and "soldering pass/fail data", each along with associated locations, from the surface mount line 2. Furthermore, the primary recorder 21 also receives and records the scan result of the QR code. Here, an ID is formed from the scan result of the QR code and a string representing a location. A component 103 packaged on a location of a substrate is identified by this ID and the design data of the electronic device 104. The primary recorder 21 stores these data in a prescribed folder for a certain period.

Here, the data format of the "printing quality data", the "mounting quality data", and the "soldering pass/fail data" is specified by the property of each data and the specification of each inspector. For example, as described above, the number of sets of numerical data for each component 103 included in the "printing quality data" depends on the type of the component 103. On the other hand, with regard to the "mounting quality data", which represents the amount of displacement of the component 103, one set of numerical data exists for each component. With regard to the "soldering pass/fail data", which represents conforming/defective for each component 103, one data originally exists for each component 103. However, the soldering inspector 16 illustratively outputs only the names of components for "NG". Hence, as shown in FIG. 3A, the data format of the "printing quality data", the "mounting quality data", and the "soldering pass/fail data" is different from each other. Furthermore, the number of lines in the "printing quality data" varies with components. Therefore, with these data left as they are, it is difficult to associate the data with the components 103 in a unified manner.

In this situation, the data registration tool 22 regularly monitors the folder as shown in step S11 of FIG. 4. More specifically, the data registration tool 22 automatically accesses the primary recorder 21 at a fixed time every day and monitors the data recorded in the above folder of the primary recorder 21. Then, as shown in step S12, the data recorded in the primary recorder 21 is matched with a template of each data format of the "printing quality data", the "mounting quality data", and the "soldering pass/fail data" to discriminate the "printing quality data", the "mounting quality data", and the "soldering pass/fail data" from the data recorded in the primary recorder 21. By means of keywords entered in each data such as keywords of the type of surface mount lines and apparatuses, the line and apparatus where these data have been created are discriminated. Next, as shown in step S13, the data discriminated in step S12 are extracted and retrieved along with the ID.

Next, as shown in step S14, the data are processed to calculate "representative data" for each component 103 from the "printing quality data". For example, the height and volume of the solder 102 included in the "printing quality data" are aggregated for each component 103 to calculate statistics such as the average and standard deviation.

Next, as shown in step S15, the data are registered in the secondary recorder 23. More specifically, the "mounting quality data", the "soldering pass/fail data", and the ID retrieved from the primary recorder 21 in step S13 and the "representative data" calculated from the "printing quality data" in step S14 are recorded in the secondary recorder 23. In these data, as shown in FIG. 3B, the "representative data", the "mounting quality data", and the "soldering pass/fail data" are associated with the component 103 identified by the ID. Preferably, a plurality of tables are created in the secondary recorder 23 for sequentially writing data in each table. Thus the data processing speed can be enhanced by parallel processing.

On the other hand, as shown in step S21 of FIG. 5, the SPC tool 24 is also regularly activated and accesses the secondary recorder 23. Then, as shown in step S22, from among the data recorded in the secondary recorder 23 (see FIG. 3B), the data of the components with the "soldering pass/fail data" being "OK" (conforming items) are extracted.

Next, as shown in step S23, the data extracted in step S22 are processed to create data for SPC determination and data for creating a graph. For example, from the extracted data, average X and standard deviation σ are calculated for each type of components 103 with regard to the numerical data such as the average height and the average volume of solder and the amount of displacement in the X-direction and the Y-direction at the time of mounting to define control bounds inside the specification bounds. For example, the upper control bound is set to X+3σ, and the lower control bound is set to X−3σ. The above numerical data are aggregated for each operation shift, for example.

Next, as shown in step S24, a graph is created on the basis of the data aggregated in step S23. For example, as shown in FIG. 6, in the case where the component 103 is a connector, a graph is created in which the average (X), the upper dispersion (X+3σ), and the lower dispersion (X−3σ) for the amount of displacement in the Y-direction are plotted for each shift. Thus the transition of process capability is visualized. For example, FIG. 6 demonstrates improvement in accuracy of mounting connectors, as the maintenance of the mounter 13 is performed between the shift B on date t and the shift A on date t+1.

Next, as shown in step S25, on the basis of the control bounds defined in step S23, it is determined whether the solder printer 11 and the mounter 13 need adjustment. In the following, a specific determination method is described. For the solder printer 11, with regard to the average and standard deviation of solder height and the average and standard deviation of solder volume, the "pass ratio" is defined as the ratio of instances falling within the range between the upper control bound and the lower control bound (control range) versus the total number of components processed by the solder printer 11, and it is determined whether this pass ratio falls below a target value. If the pass ratio is more than or equal to the target value, it is determined that the solder printer 11 does not need adjustment. However, if the pass ratio is less than the target value, it is determined whether the amount of solder is too large or too small on the basis of the statistics of solder height and solder volume. For the mounter 13, the maximum and standard deviation of the amount of displacement in the X-direction and the Y-direction are compared with associated reference values for each type of components 103. If both the maximum and the standard deviation exceed the reference values, it is determined that the mounter 13 needs adjustment.

If it is determined in step S25 that the solder printer 11 or the mounter 13 needs adjustment, then as shown in step S26, an electronic mail is sent to the operator M, providing a notification that the solder printer 11 or the mounter 13 needs adjustment, at the time of mounting the target type of components 103. Furthermore, as shown in step S27, an operation instruction is issued on a web page. The operation instruction describes the content of operations for decreasing or increasing the amount of solder printed by the solder printer 11, or the content of operations for adjusting the mounter 13.

In an example, the operation instruction for decreasing the amount of solder describes adjusting printing conditions such as printing speed, printing pressure, and clearance to within a prescribed control range, and checking the adhesion state of solder on the backside of the mask. The operation instruction for increasing the amount of solder describes adjusting the printing conditions to within a prescribed control range and checking the absence of residual solder on the mask. Furthermore, the operation instruction for adjusting the mounter describes checking the presence/absence of biting of components into the feeder set, checking the presence/absence of displacement of the sucking position, and checking the presence/absence of abnormal noise.

In response to receipt of the electronic mail, the operator M is informed that the solder printer 11 or the mounter 13 needs adjustment, and can recognize the specific content of operations by checking the operation instruction issued on the web page. Then the operator M adjusts the solder printer 11 or the mounter 13 as described in the operation instruction, and thereby the printing state of solder or the mounting state of components returns to good condition.

Thus the surface mount line 2, the data registration tool 22, and the SPC tool 24 operate in parallel. The process control system 3 collects information about the intermediate and final quality of the electronic device 104 from the surface mount line 2 in operation, determines on the basis thereof whether each apparatus constituting the surface mount line 2 needs adjustment, and informs the operator of the determination result. Thus the operation of the surface mount line 2 can be provided with feedback.

Next, the effect of this embodiment is described.

In this embodiment, the solder print inspector 12 inspects the solder 102 printed by the solder printer 11 and outputs the result as quantitative numerical data. The mount inspector 14 inspects the state of components 103 mounted by the mounter 13 and outputs the result as quantitative numerical data. The data registration tool 22 processes these data. On the basis of the processed data, the SPC tool 24 can determine whether the solder printer 11 or the mounter 13 needs adjustment. Thus, according to this embodiment, on the basis of the intermediate quality of products, it can be determined whether the surface mount line needs adjustment. Consequently, even if the state of materials such as the viscosity of solder paste changes, the apparatuses can be adjusted accordingly to make the quality of products stable and good. Thus the process control can be provided with high accuracy.

According to this embodiment, among the data retrieved from the primary recorder 21 by the data registration tool 22, the "printing quality data" is used to calculate "representative data" for each component 103, and the "representative data" and the "mounting quality data" are associated with the "soldering pass/fail data" and recorded in the secondary recorder 23. Thus the SPC tool 24 can perform process control on the basis of only the "representative data" and the "mounting quality data" of the components 103 with the "soldering pass/fail data" being "OK". That is, the data of the components 103 with the "soldering pass/fail data" being "NG" can be excluded from the data group used as the basis for process control. Consequently, noise data such as data attributed to the inherent defect of the substrate is excluded, and only the data that can be controlled by apparatus and process conditions are collected, so that a data group serving as the basis for process control can be established. Thus the process control can be provided with higher accuracy.

In this embodiment, the SPC tool 24 defines a control range inside the specification range and determines on the basis of this control range whether the apparatuses need adjustment. Hence measures can be taken before occurrence of electronic devices falling outside the specification range, that is, defective items.

In this embodiment, when the SPC tool 24 determines that the solder printer 11 or the mounter 13 needs adjustment, it issues an operation instruction that specifically describes operations needed for adjustment depending on the direction of the adjustment. Hence the operator can easily and rapidly perform adjustment operations. Adjustment operations for the solder printer, the mounter, and other apparatuses constituting the surface mount line often require considerable manpower. By issuing the operation instruction as described above, the efficiency of operation does not depend on the operator's skill or know-how, and stable adjustment result can be obtained. Hence this embodiment achieves high stability and responsively in process control.

According to this embodiment, the primary recorder 21 for receiving primary data, that is, ID, "printing quality data", "mounting quality data", and "soldering pass/fail data" from the surface mount line 2, and the secondary recorder 22 for retaining secondary data for process control are separately provided. Thus the input operation for the primary data and the SPC (statistical process control) using the secondary data can be performed in parallel, and the processing speed can be enhanced.

The invention has been described with reference to the embodiment. However, the invention is not limited to the embodiment. For example, addition, deletion, and modification of steps and apparatuses in the above embodiment can be suitably made by those skilled in the art, and such variations are also encompassed within the scope of the invention as long as they include the features of the invention.

For example, in this embodiment, the two-dimensional barcode scanner 10 is provided at the most upstream position of the surface mount line 2 to scan a QR code before the printing step. However, in addition thereto, the QR code can be scanned also before the mount inspection step and before the soldering inspection step.

In this embodiment, the SPC tool 24 sends an electronic mail to alert the operator to the need for apparatus adjustment, and posts an operation instruction on the web to transmit the content of the operation. However, the invention is not limited thereto. For example, notification of apparatus adjustment may be displayed on a display screen, and the operation instruction may be printed out each time for documentation.

In this embodiment, the primary data is illustratively obtained for all the components. However, the invention is not limited thereto, but the primary data may be sampled from selected components. For example, the "printing quality data" may be obtained only from some components selected from each cell, only from components with high defective rate, or only from components with large opening. In the case with a plurality of mounters, the "mounting quality data" may be obtained from three to ten components selected for each mounter and each mode of feeding components. Thus, by obtaining data only from limited components, the data processing speed can be enhanced, and the efficiency of process control can be improved.

The invention claimed is:

1. A process control method for a surface mount line including a solder printer configured to print solder on a surface of a substrate, a solder print inspector configured to inspect the printed solder and outputting printing quality data, a mounter configured to mount components on the substrate with the solder printed, a mount inspector configured to inspect a state of the mounted components and outputting mounting quality data, a reflow furnace configured to heat the solder to solder the components to the substrate, and a soldering inspector configured to inspect a state of the soldering and outputting soldering pass/fail data, the process control method comprising:

retrieving the printing quality data, the mounting quality data, and the soldering pass/fail data from a primary recorder with the printing quality data, the mounting quality data, and the soldering pass/fail data recorded therein, calculating representative data for each of the components from the printing quality data, and recording the representative data, the mounting quality data, and the soldering pass/fail data for each of the components in a secondary recorder; and determining whether the solder printer and the mounter need adjustment by using the data of the components with the soldering pass/fail data indicating conforming among the data recorded in the secondary recorder by a computer, wherein the printing quality data includes numerical data representing a shape of the solder printed on each electrode of the substrate, the representative data includes statistics obtained by aggregating the numerical data for each of the components, and the statistics includes an average and a standard deviation of the numerical data.

2. The process control method according to claim 1, wherein the determining further includes issuing an operation instruction to adjust the solder printer in response to the determination that the solder printer needs adjustment, and issuing an operation instruction to adjust the mounter in response to the determination that the mounter needs adjustment.

3. A process control method for a surface mount line including a solder printer configured to print solder on a surface of a substrate, a solder print inspector configured to inspect the printed solder and outputting printing quality data, a mounter configured to mount components on the substrate with the solder printed, a mount inspector configured to inspect a state of the mounted components and outputting mounting quality data, a reflow furnace configured to heat the solder to solder the components to the substrate, and a soldering inspector configured to inspect a state of the soldering and outputting soldering pass/fail data, the process control method comprising:
retrieving the printing quality data, the mounting quality data, and the soldering pass/fail data from a primary recorder with the printing quality data, the mounting quality data, and the soldering pass/fail data recorded therein, calculating representative data for each of the components from the printing quality data, and recording the representative data, the mounting quality data, and the soldering pass/fail data for each of the components in a secondary recorder; and
determining whether the solder printer and the mounter need adjustment by using the data of the components with the soldering pass/fail data indicating conforming among the data recorded in the secondary recorder by a computer,
wherein the determining includes;
defining an upper control bound and a lower control bound for each type of the components by using the data of the components with the soldering pass/fail data indicating conforming; and
determining whether the solder printer needs adjustment by using the upper control bound and the lower control bound.

4. The process control method according to claim 3, wherein the determining by using the upper control bound and the lower control bound includes:
defining a ratio of instances of which the representative data falls within the range between the upper control bound and the lower control bound versus a total number of the components processed by the solder printer; and
determining in such a manner that, if the ratio is more than or equal to a target value, it is determined that the solder printer does not need adjustment and, if the ratio is less than the target value, it is determined whether the amount of solder is too large or too small on the basis of the representative data.

5. A process control method for a surface mount line including a solder printer configured to print solder on a surface of a substrate, a solder print inspector configured to inspect the printed solder and outputting printing quality data, a mounter configured to mount components on the substrate with the solder printed, a mount inspector configured to inspect a state of the mounted components and outputting mounting quality data, a reflow furnace configured to heat the solder to solder the components to the substrate, and a soldering inspector configured to inspect a state of the soldering and outputting soldering pass/fail data, the process control method comprising:
retrieving the printing quality data, the mounting quality data, and the soldering pass/fail data from a primary recorder with the printing quality data, the mounting quality data, and the soldering pass/fail data recorded therein, calculating representative data for each of the components from the printing quality data, and recording the representative data, the mounting quality data, and the soldering pass/fail data for each of the components in a secondary recorder by a computer; and
determining whether the solder printer and the mounter need adjustment by using the data of the components with the soldering pass/fail data indicating conforming among the data recorded in the secondary recorder by a computer,
wherein the mounting quality data includes amount of displacement of a mounting position of the component from a scheduled mounting position of the component on the substrate, and
wherein the determining includes determining in such a manner that a maximum and a standard deviation of the amount of displacement are compared with associated reference values for each type of the components and, if both the maximum and the standard deviation exceed the reference values, it is determined that the mounter needs adjustment.

6. A data registration program for a surface mount line including a solder printer configured to print solder on a surface of a substrate, a solder print inspector configured to inspect the printed solder and outputting printing quality data, a mounter configured to mount components on the substrate with the solder printed, a mount inspector configured to inspect a state of the mounted components and outputting mounting quality data, a reflow furnace configured to heat the solder to solder the components to the substrate, and a soldering inspector configured to inspect a state of the soldering and outputting soldering pass/fail data, the data registration program registering each of the data by causing a computer to execute:
retrieving the printing quality data, the mounting quality data, and the soldering pass/fail data from a primary recorder with the printing quality data, the mounting quality data, and the soldering pass/fail data recorded therein;
calculating representative data for each of the components from the printing quality data; and
recording the representative data, the mounting quality data, and the soldering pass/fail data for each of the components in a secondary recorder,
wherein the printing quality data includes numerical data representing a shape of the solder printed on each electrode of the substrate, and the representative data includes statistics obtained by aggregating the numerical data for each of the components, and
wherein the statistics include an average and a standard deviation of the numerical data.

7. The data registration program according to claim 6, wherein the mounting quality data includes amount of displacement of a mounting position of the component from a scheduled mounting position of the component on the substrate.

8. A method for manufacturing an electronic device with components packaged on a substrate, the method comprising:
printing solder on a surface of the substrate;
inspecting the printed solder and recording printing quality data in a primary recorder;
mounting the components on the substrate with the solder printed;

inspecting a state of the mounted components and recording mounting quality data in the primary recorder;
heating the solder to solder the components to the substrate;
inspecting a state of the soldering and recording soldering pass/fail data in the primary recorder;
retrieving the printing quality data, the mounting quality data, and the soldering pass/fail data from the primary recorder, calculating representative data for each of the components from the printing quality data, and recording the representative data, the mounting quality data, and the soldering pass/fail data for each of the components in a secondary recorder;
determining whether the solder printer and the mounter need adjustment by using the data of the components with the soldering pass/fail data indicating conforming among the data recorded in the secondary recorder by a computer; and
adjusting the solder printer in response to the determination in the determining step that the solder printer needs adjustment, and adjusting the mounter in response to the determination in the determining step that the mounter needs adjustment, wherein
the printing quality data includes numerical data representing a shape of the solder printed on each electrode of the substrate, and the representative data includes statistics obtained by aggregating the numerical data for each of the components, and
the statistics include an average and a standard deviation of the numerical data.

9. The method for manufacturing an electronic device according to claim 8, wherein the adjusting includes issuing an operation instruction to adjust the solder printer in response to the determination that the solder printer needs adjustment, and issuing an operation instruction to adjust the mounter in response to the determination that the mounter needs adjustment.

10. A method for manufacturing an electronic device with components packaged on a substrate, the method comprising:
printing solder on a surface of the substrate;
inspecting the printed solder and recording printing quality data in a primary recorder;
mounting the components on the substrate with the solder printed;
inspecting a state of the mounted components and recording mounting quality data in the primary recorder;
heating the solder to solder the components to the substrate;
inspecting a state of the soldering and recording soldering pass/fail data in the primary recorder;
retrieving the printing quality data, the mounting quality data, and the soldering pass/fail data from the primary recorder, calculating representative data for each of the components from the printing quality data, and recording the representative data, the mounting quality data, and the soldering pass/fail data for each of the components in a secondary recorder;
determining whether the solder printer and the mounter need adjustment by using the data of the components with the soldering pass/fail data indicating conforming among the data recorded in the secondary recorder by a computer; and
adjusting the solder printer in response to the determination in the determining step that the solder printer needs adjustment, and adjusting the mounter in response to the determination in the determining step that the mounter needs adjustment,
wherein the determining includes;
defining an upper control bound and a lower control bound for each type of the components by using the data of the components with the soldering pass/fail data indicating conforming; and
determining whether the solder printer needs adjustment by using the upper control bound and the lower control bound.

11. The method for manufacturing an electronic device according to claim 10, wherein the determining by using the upper control bound and the lower control bound includes:
defining a ratio of instances of which the representative data falls between the upper control bound and the lower control bound versus a total number of components processed by the solder printer; and
determining in such a manner that, if the ratio is more than or equal to a target value, it is determined that the solder printer does not need adjustment and, if the ratio is less than the target value, it is determined whether the amount of solder is too large or too small on the basis of the representative data.

12. A method for manufacturing an electronic device with components packaged on a substrate, the method comprising:
printing solder on a surface of the substrate;
inspecting the printed solder and recording printing quality data in a primary recorder;
mounting the components on the substrate with the solder printed;
inspecting a state of the mounted components and recording mounting quality data in the primary recorder;
heating the solder to solder the components to the substrate;
inspecting a state of the soldering and recording soldering pass/fail data in the primary recorder;
retrieving the printing quality data, the mounting quality data, and the soldering pass/fail data from the primary recorder, calculating representative data for each of the components from the printing quality data, and recording the representative data, the mounting quality data, and the soldering pass/fail data for each of the components in a secondary recorder;
determining whether the solder printer and the mounter need adjustment by using the data of the components with the soldering pass/fail data indicating conforming among the data recorded in the secondary recorder by a computer; and
adjusting the solder printer in response to the determination in the determining step that the solder printer needs adjustment, and adjusting the mounter in response to the determination in the determining step that the mounter needs adjustment,
wherein the mounting quality data includes amount of displacement of a mounting position of the component from a scheduled mounting position of the component on the substrate,
wherein the determining includes determining in such a manner that a maximum and a standard deviation of the amount of displacement are compared with associated reference values for each type of the components and, if both the maximum and the standard deviation exceed the reference values, it is determined that the mounter needs adjustment.

* * * * *